United States Patent [19]

Chang et al.

[11] 4,144,634
[45] Mar. 20, 1979

[54] FABRICATION OF GALLIUM ARSENIDE MOS DEVICES

[75] Inventors: Chuan C. Chang, Berkeley Heights; Robert P. H. Chang, Warren; James J. Coleman, Plainfield; Tan T. Sheng, Berkeley Heights, all of N.J.

[73] Assignee: Bell Telephone Laboratories, Incorporated, Murray Hill, N.J.

[21] Appl. No.: 810,771

[22] Filed: Jun. 28, 1977

[51] Int. Cl.² .................................................. B01J 17/00
[52] U.S. Cl. ........................................ 29/571; 29/584; 204/164; 204/192 C
[58] Field of Search .................. 29/571, 584; 204/164, 204/192

[56] References Cited

U.S. PATENT DOCUMENTS 4,062,747  12/1977  Chang .................................. 204/164

OTHER PUBLICATIONS

Electronics Letters, vol. 13, No. 2, Jan. 20, 1977, "Stable Charge Storage of M.A.O.S. etc.," by Bayraktaroglu et al., pp. 45 & 46.

*Primary Examiner*—W. Tupman
*Attorney, Agent, or Firm*—Peter V. D. Wilde

[57] ABSTRACT

A method of fabricating gallium arsenide MOS devices with improved stoichiometric and electrical properties is disclosed. The device includes a gallium arsenide substrate overlaid with a native oxide and an aluminum oxide layer. The device is fabricated using a plasma oxidizing process.

5 Claims, 5 Drawing Figures

FABRICATION OF GALLIUM ARSENIDE MOS DEVICES

BACKGROUND OF THE INVENTION

1. Field of the Invention

This invention involves techniques for fabricating improved MOS devices.

2. Description of the Prior Art

Recent developments in semiconductor technology have resulted in the emergence of the MOS structure as a predominant building block in electronic devices. The most prevalent MOS devices involve silicon. Although, qallium arsenide has very attractive features including a larger bandgap, higher mobility and light production capabilities, gallium arsenide MOS technology has lagged far behind silicon technology. In large part this lag has been associated with an inability to produce gallium arsenide oxide layers with the requisite surface state and electrical properties. MOS curves for gallium arsenide devices show significant leakage and the deleterious effects of surface states precluding the large scale application of such structures to commercial devices.

The poor electrical properties which are usually found in gallium arsenide MOS devices are due in part to an imbalance between the gallium and arsenic concentrations in both the interface and bulk regions of the native oxide. This astoichiometry may be associated with the high mobility of the arsenic during the oxidation and annealing steps and its resultant out-diffusion from the gallium arsenide substrate. This out-diffusion may be understood by considering that the arsenic containing species are less strongly bound to their surroundings than the gallium containing species, with the resultant freeing of the arsenic species from both the oxide and interface regions during the oxidation and annealing steps. In addition to these properties, impurity states throughout the native oxide also affect the electrical properties of the device, its surface state density, and the observed leakage between the semiconductor and the metal.

Despite the difficulties encountered in producing reasonable gallium arsenide MOS devices the inherent attractiveness of gallium arsenide has spurred continuing efforts in this direction. A recent relevant example may be found in the Jan. 20, 1977, issue of *Electronic Letters,* at page 45. In this communication, H. L. Hartnagel and his coworkers describe two MOS devices with multilayered oxides. In one, a thin (approximately 150 Angstroms) aluminum layer is anodically oxidized while on a gallium arsenide substrate. During this process a gallium arsenide oxide layer appears over the aluminum oxide layer. This structure is described as having improved MOS diode characteristics. For comparison with the invention described herein, it should be emphasized that in the reported Hartnagel structure the gallium arsenide oxide is not grown directly on the gallium arsenide substrate. Rather an intervening aluminum oxide layer appears between the gallium arsenide substrate and the native oxide layer. The second structure described by Hartnagel is more comparable to the structure described herein. In this second structure a thick (greater than 500 Angstroms) aluminum oxide layer is anodically grown together with, and over, a native gallium arsenide oxide layer, in an otherwise classical MOS structure. While this configuration is similar in its broad outlines to the structure which will be described below, Hartnagel does not report useful MOS characteristics for this structure and, in fact, suggests this structure for use as a charge storage device.

SUMMARY OF THE INVENTION

This invention is a method of fabricating improved gallium arsenide MOS devices. The method includes depositing a thin layer of aluminum (less than 400 Angstroms) over a gallium arsenide substrate and, subsequently, oxidizing the aluminum and part of the underlying substrate by means of a specific plasma oxidation process. When fabricated in this manner, the device is found to have a polarity independent breakdown strength in excess of $4 \times 10^6$ volts/cm and a surface state density of less than $10^{11}/\text{cm}^2$. The CV curve associated with this device saturates in both the inversion and accumulation regions with a slope, $\Delta c/\Delta V$, of absolute value less than 0.02pF/Volt. The total arsenic excess at the native oxide-semiconductor interface is less than $1.5 \times 10^{15}$ atoms/$\text{cm}^2$ for an interface width of 60 Angstroms and an oxide thickness of 3000 Angstroms. Both the interface width and the density of excess arsenic at the interface vary approximately linearly with the oxide thickness.

DETAILED DESCRIPTION

Figure 1:
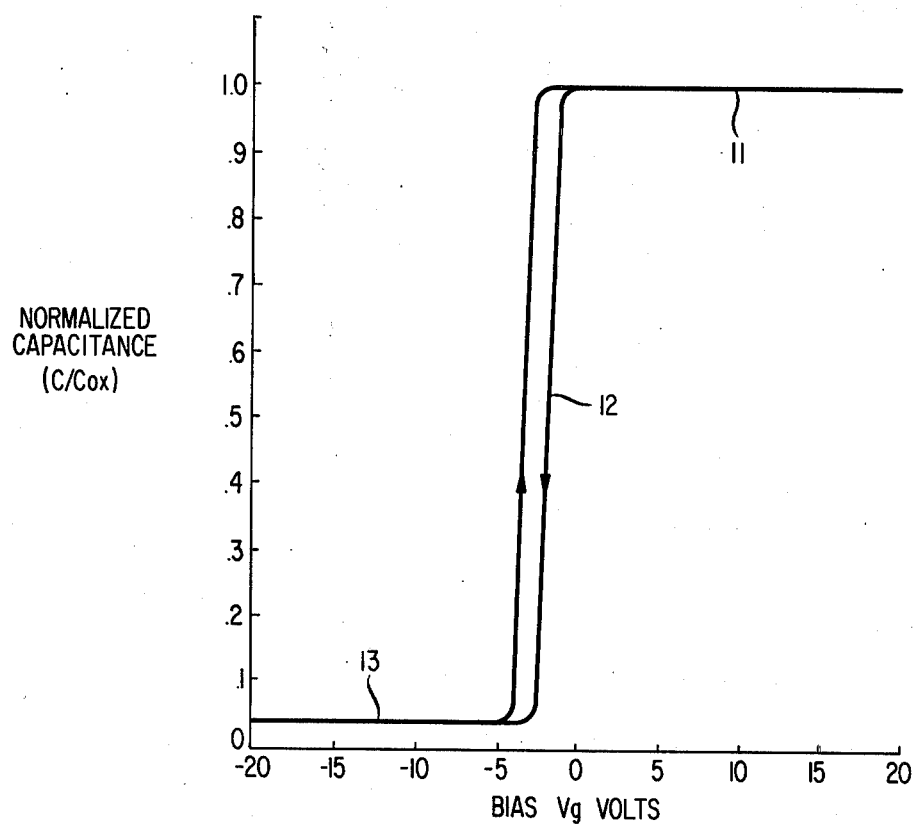
FIG. 1 is a CV curve for the device fabricated according to the teachings of this invention.

This invention is a method of fabricating an MOS device with improved electrical characteristics. While the description is presented in terms of an individual MOS structure, it is clear that the invention may be practiced in the fabrication of more complicated structures or of groups of structures which include the basic MOS configuration as an element. The invention utilizes a specific plasma oxidation technique disclosed in a commonly assigned application Ser. No. 696,282, filed June 15, 1976, by R. P. H. Chang and A.K. Sinha. That disclosure is consequently incorporated by reference into this specification.

This invention involves fabricating an MOS device with a double oxide layer comprising a native oxide of thickness between 500 and 4000 Angstroms overlaid with an aluminum oxide layer produced from an aluminum layer of thickness less than 400 Angstroms. The thickness of the various layers may differ in alternative embodiments. In such embodiments the native oxide may be less than 2000 Angstroms and/or the oxide thickness may be less than 200 or even 100 Angstroms. Prior to oxidation an aluminum layer of appropriate thickness is deposited on a gallium arsenide substrate using any convenient deposition process, such as, for example, evaporation. This structure is then placed in an oxygen environment comprising oxygen at a pressure of less than $9 \times 10^{-3}$ torr. A beam comprising essentially electrons of density between $10^8$ electrons/cc and $10^{12}$ electrons/cc is directed toward the structure. These electrons may be produced in an appropriate plasma. During this process the structure is biased between 0.2 and 500 volts positive with respect to the electron source. This exposure results in the oxidation of the aluminum and the growth of an underlying native gallium arsenide oxide. Subsequent to this growth the structure is annealed according to techniques well known in the art to lower the interface surface state density. During the oxidation process some gallium arsenide oxide may grow on top of the aluminum oxide layer. Part of this oxide layer may sublimate during the annealing process. Any remaining gallium arsenide oxide which grows over the aluminum oxide layer may be removed by standard etching techniques if so desired.

During the annealing process there is some loss of the arsenic containing species from both the native oxide and the interface region. This loss mechanism, thought to be associated with the out-diffusion of arsenic species from the structure's surface, seriously degrades the electrical properties of the resultant device. However, we have found that the specific fabrication parameters discussed in this specification minimize these deleterious effects of annealing while allowing reduction in the surface state density which normally occurs during the annealing process. The resultant structure displays the beneficial properties of high breakdown and low leakage, both of which may be partly attributed to the aluminum oxide layer, while retaining the desirable properties associated with a native gallium arsenide oxide MOS device. All of this is accomplished through the use of an aluminum oxide layer sufficiently thin to be easily removed in subsequent processes if so desired.

ELECTRICAL PROPERTIES

Electrical properties of the MOS device fabricated according to the teachings of this invention may be most effectively displayed by means of the CV curve shown in FIG. 1. This curve is a standard CV curve obtained using traditional measurement techniques. The curve was taken with a high frequency (1 megahertz) 15 millivolt modulation on a DC bias. The sweep rate was approximately 5V/minute. Strong saturation is shown in both the accumulation region 11 and the inversion region 13. The asymptotic slopes in these regions have an absolute value less than 0.02pF/V. The depletion region shows a very sharp drop extending over a region of less than 0.5V. It is estimated from this curve that the surface state concentration is less than $1 \times 10^{11}/cm^2$. In one specific run, the surface state concentration was less than $5 \times 10^{10}/cm^2$. This low surface state concentration is due in part to the improved stoichiometry which exists in both the oxide layer and the interface region between the native oxide and the gallium arsenide substrate. While some arsenic loss is experienced during the annealing step, the specific configuration described in this specification allows for only minimal arsenic loss while permitting the requisite hydrogen diffusion necessary to further reduce the surface state density as commonly observed during annealing processes.

DETAILS OF THE FABRICATION

Figure 2:
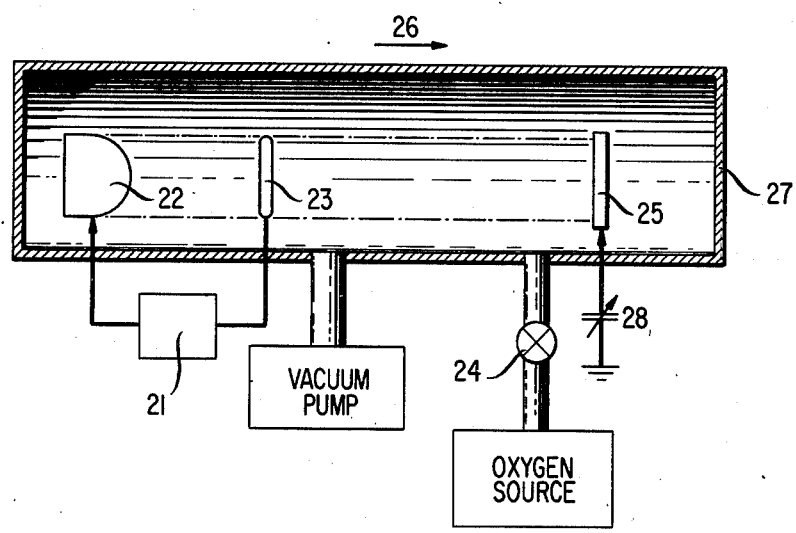
FIG. 2 is a schematic representation of an apparatus used in the fabrication of this device.

The generic plasma oxidation process referred to above is carried out in a large capacity, multipurpose plasma reactor 27 shown schematically in FIG. 2. Generally, in our work an oxygen plasma (density of $10^{10}$ particles/cc, $T_e = 4eV$) was formed at a background pressure of $10^{-3}$ torr regulated in part by valve 24. A pair of rf aluminum electrodes 22 and 23 were driven in balance at the same dc potential with a typical rf power of 200 watts at 30 MHz supplied by an appropriate power supply 21. The plasma thus formed in the source region of the plasma device was confined by an external magnetic field 26 of a few hundred Gauss. The magnetic field need not be this large but is usually greater than 50 Gauss. The plasma column was 5 cm in diameter, and was substantially uniform across this region. The sample, a gallium arsenide wafer with a thin aluminum film evaporated on it, was mounted on a substrate holder and immersed in the oxygen plasma with the sample at least 30 cm away from the electrodes to avoid sputtering contamination from the electrodes. The aluminum film will usually be less than 400 Angstroms thick but may be less than 100 Angstroms to simplify subsequent removal if desired. The sample surface normal was approximately parallel to the magnetic field lines. The substrate was then biased at 50V positive with respect to the plasma by means of voltage source 28. The aluminum was evaporated, and the thickness was determined with a rate monitor.

The samples were studied using Auger Electron Spectroscopy and Transmission Electron Microscopy (TEM). Quantitative depth profiles were obtained using an ion-mill-Auger method. The Auger apparatus was a Varian$^R$ Cylindrical Mirror Analyzer with a 10 keV electron gun, operated at 6keV. The ion gun was operated at 1 to 2 keV, in a static Ar pressure of $6.5 \times 10^{-5}$ torr. The TEM data were obtained using cross-sections of the sample taken perpendicular to the plane of the aluminum film so that the layer structure of the oxidized film could be studied. The sectioning technique and other experimental details are fully described in the art.

Figure 3:
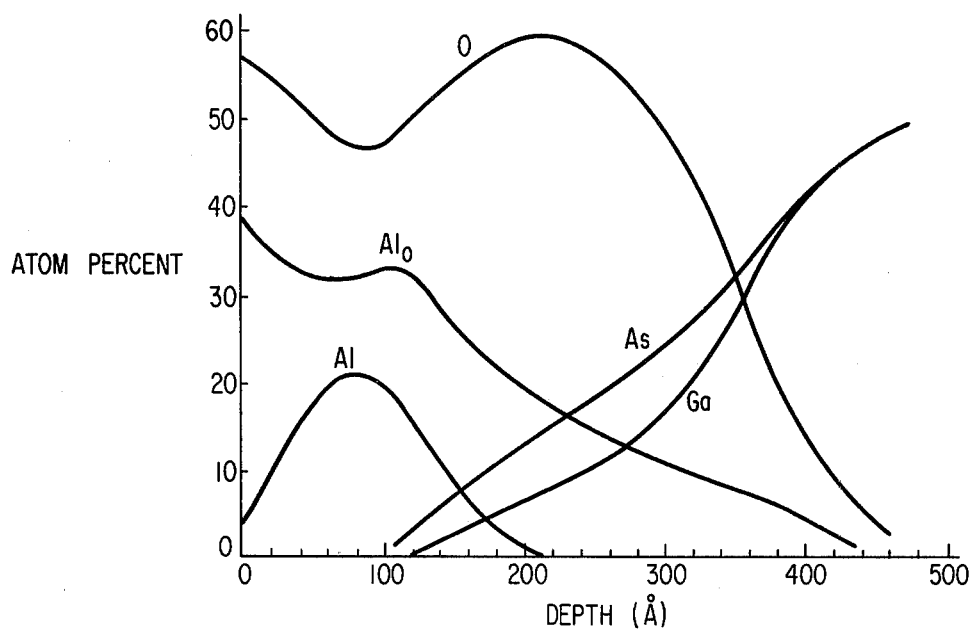
FIGS. 3, 4, and 5 are plots of the composition of the device at the various stages of the fabrication process.
Figure 4:
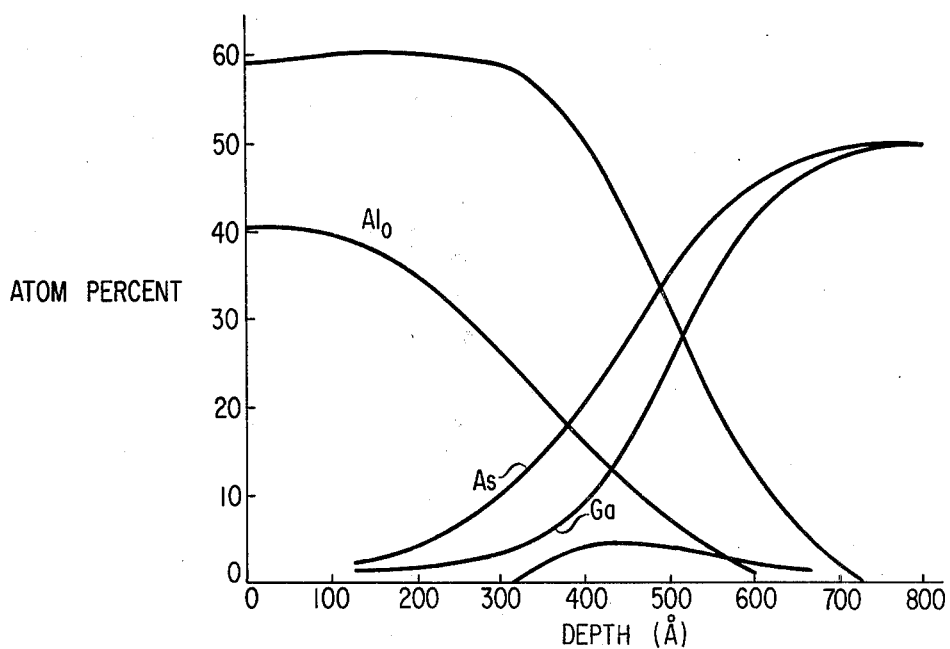
Figure 5:
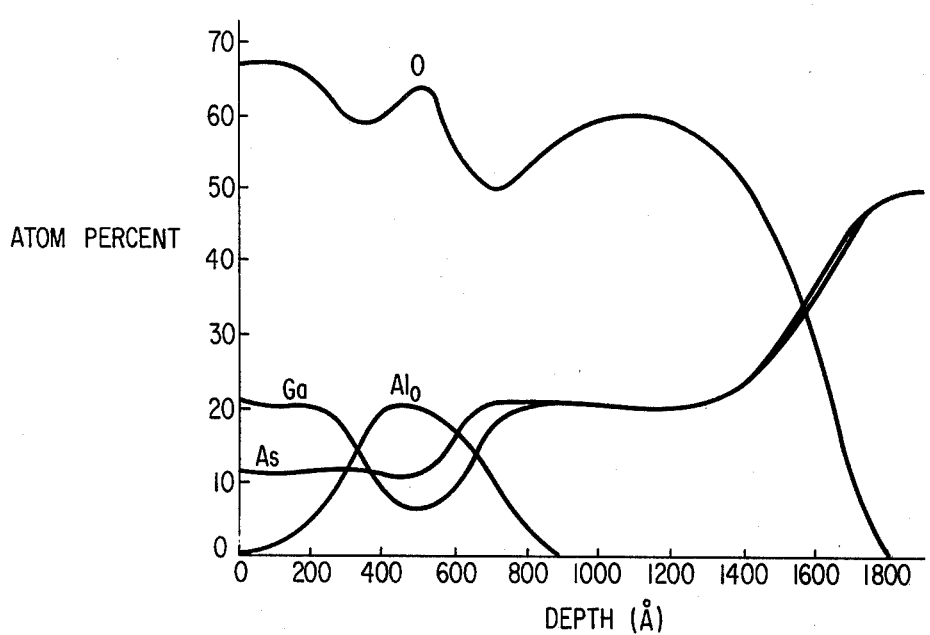

Chemical depth profiles through three plasma-oxidized samples are displayed in FIGS. 3, 4, and 5. These samples represent increasing degrees of oxidation and they were prepared as follows:

| Figure: | 3 | 4 | 5 |
| --- | --- | --- | --- |
| Sample: | 2242 | 2252 | 2231 |
| Al Thickness: | 100A | 150A | 100A |
| Oxidation Time: | 5 min. | 15 min. | 20 min. |

The following chemical species are plotted in the profiles: Al — elemental aluminum; $Al_O$— aluminum in Al-oxide; O — oxygen; Ga — gallium, sum of oxidized and unoxidized species; As — arsenic, sum of oxidized and unoxidized species.

The profile of FIG. 3 shows that the sample surface is a layer of almost pure Al-oxide. At about 80 Angstroms into the surface is a region containing unoxidized aluminum. Further into the film is a region with Al-oxide (no elemental Al), followed by some gallium arsenide oxide and then the gallium arsenide substrate. The fact that Al-oxide is found on both sides of the layer containing elemental aluminum is due to rapid grain boundary oxidation of aluminum followed by a slower oxidation towards the center of each aluminum grain. Although the elemental aluminum Auger signal is detected at the surface of the sample, the surface aluminum is actually completely oxidized and elemental aluminum is estimated to appear first at about 50 Angstroms below the surface, using our method of measuring surface Al-oxide thickness. The reason for detection of the elemental aluminum Auger signal at the surface is that some of the energetic Auger electrons from elemental aluminum more than 50 Angstroms below the surface can traverse the oxide and be detected. Comparison of the depth profiles of gallium and arsenic show that some gallium has been lost, probably by out-diffusion to the surface and subsequent desorption. This suggests that gallium diffusion through the aluminum containing layer is faster than arsenic diffusion.

Depth profiles through a sample with aluminum (initial thickness 150 Angstroms) almost completely oxidized is shown in FIG. 4. The major difference between FIGS. 3 and 4, besides the thicker aluminum and higher degree of oxidation, is the presence of unoxidized aluminum near the oxide-gallium arsenide interface, rather than in the center of the aluminum containing layer. We do not know whether this unoxidized aluminum is elemental aluminum or some aluminum-gallium arsenide phase. However, the effective thickness of this aluminum layer is only about 20 Angstroms. Again, gallium loss is apparent. Although gallium (and probably arsenic) out-diffusion took place, only trace quantities of gallium and arsenic could be detected on the sample surface.

FIG. 5 shows an extensively oxidized sample. No elemental aluminum could be detected, and the Al-oxide layer is sandwiched between two gallium arsenide oxide layers. The sandwich configuration proves that oxygen migrates through the Al-oxide layer to oxidize the gallium arsenide and that in turn gallium and arsenic migrate in the opposite direction through the Al-oxide layer towards the surface. These are the expected directions of migration for oxygen, gallium and arsenic ions under the positive voltage bias applied to the surface. The gallium arsenide oxide layer at the surface is deficient in arsenic, so that arsenic is preferentially lost through this layer. However, in the Al-oxide layer, the reverse is true, in agreement with FIGS. 3 and 4. The third layer is a gallium arsenide oxide in which the arsenic excess is less than $1 \times 10^{15}$ atoms/cm$^2$. The aluminum oxide layer acts as a preferential filter for the migration of the ion species.

EXAMPLE

In a specific embodiment of the above-described invention, the various oxide layers were grown using the plasma apparatus described above. An epitaxially grown GaAs sample $\frac{1}{4} \times \frac{1}{2}$ inch with an effective dopant concentration of approximately $10^{13}$/cm$^3$ was cleaned with trichlorethylene, acetone, and alcohol. A 100 Angstrom thick film of aluminum was then evaporated on the gallium arsenide substrate and subsequent to this evaporation the surface was cleaned again as above. The sample was then placed in a boron nitride holder. Any insulating holder that does not contaminate the substrate during the oxidation, as a result of sputtering, may be used. The sample and holder were placed in a plasma growth apparatus as described in the body of the specification and the apparatus was operated under the conditions described above. During the growth the sample was biased positively with respect to ground at a voltage which resulted in a current of between 10 and 100 milliamperes. The growth can take anywhere from 10 to 200 minutes and in this particular sample the growth proceeded for 60 minutes. Subsequent to the oxidation the sample may be annealed in hydrogen at approximately one atmosphere at a temperature of between 400° and 600° C. for between 10 and 100 minutes. This particular sample was annealed at 550° C. for 30 minutes. Metal dots of aluminum or gold were then evaporated on the sample and MOS data were taken according to techniques well known in the art. The polarity independent breakdown voltage for this device was found to be greater than $4 \times 10^6$ volts/cm. The asymptotic slope in both the inversion and accumulation regions of the CV curve had an absolute value less than 0.02pF/V. The surface state density was less than $1 \times 10^{11}$ cm$^2$.

What is claimed is:

1. A method comprising
   (a) depositing an aluminum layer of thickness less than 400 Angstroms on a doped gallium arsenide substrate;
   (b) placing the substrate in an oxygen environment comprising oxygen at a pressure of less than $10^{-3}$ Torr;
   (c) directing a beam comprising essentially electrons of density between $10^8$ electrons/cm$^3$ and $10^{12}$ electrons/cm$^3$ toward the aluminum layer in part by means of a magnetic field greater than 50 Gauss;
   (d) biasing the substrate between 0.2 and 500 volts positive with respect to the source of electrons whereby a structure is formed with an aluminum oxide layer less than 400 Angstroms thick over a native oxide between 500 and 4000 Angstroms thick; and
   (e) annealing the structure;
   (f) depositing a metal electrode on the structure whereby a MOS device with a breakdown strength of greater than $\pm 4 \times 10^6$ volts/cm, an asymptotic slope in both the inversion and accumulation regions with an absolute value of less than 0.02pF/V, and a surface state density less than $1 \times 10^{11}$/cm$^2$ is formed.

2. The method of claim 1 where the aluminum layer is deposited by evaporation.

3. The method of claim 1 where the MOS device is annealed for a time period between 30 and 60 minutes.

4. The method of claim 1 where the electrons are formed in a plasma.

5. The method of claim 1 where the structure is annealed in hydrogen at approximately one atmosphere.

* * * * *